(12) United States Patent
Jang (10) Patent No.: US 11,760,046 B2
(45) Date of Patent: Sep. 19, 2023

(54) MULTI-LAYERED MICROLENS SYSTEMS AND RELATED METHODS

(71) Applicant: SEMICONDUCTOR COMPONENTS INDUSTRIES, LLC, Phoenix, AZ (US)

(72) Inventor: Min Jang, Meridian, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 231 days.

(21) Appl. No.: 16/951,091

(22) Filed: Nov. 18, 2020

(65) Prior Publication Data

US 2021/0202559 A1 Jul. 1, 2021

Related U.S. Application Data

(60) Provisional application No. 62/957,548, filed on Jan. 6, 2020, provisional application No. 62/955,712, filed on Dec. 31, 2019.

(51) Int. Cl.
| | |
|---|---|
| *B29D 11/00* | (2006.01) |
| *G02B 1/04* | (2006.01) |
| *G02B 1/11* | (2015.01) |
| *G02B 3/00* | (2006.01) |

(52) U.S. Cl.
CPC .. *B29D 11/00365* (2013.01); *B29D 11/00298* (2013.01); *G02B 1/041* (2013.01); *G02B 1/11* (2013.01); *G02B 3/0012* (2013.01)

(58) Field of Classification Search
CPC ........ B29D 11/00365; B29D 11/00298; G02B 1/041; G02B 3/0012; G02B 3/00; G02B 1/11; H01L 27/14627
See application file for complete search history.

(56) References Cited

U.S. PATENT DOCUMENTS

| 6,437,918 B1* | 8/2002 | Hamanaka ....... B29D 11/00365 359/620 |
|---|---|---|
| 10,008,529 B2* | 6/2018 | Nakashikiryo ... H01L 27/14621 |
| 2004/0214368 A1 | 10/2004 | Rhodes |
| 2005/0133688 A1 | 6/2005 | Li et al. |
| 2005/0280012 A1 | 12/2005 | Boettiger et al. |
| 2008/0048284 A1 | 2/2008 | Yun |
| 2012/0086093 A1* | 4/2012 | Otsuka .............. H01L 27/14627 257/E31.127 |

(Continued)

FOREIGN PATENT DOCUMENTS

| KR | 20130071837 A | * | 7/2013 |
|---|---|---|---|
| WO | WO-2020122032 A1 | * | 6/2020 |

*Primary Examiner* — Jia X Pan
(74) *Attorney, Agent, or Firm* — Adam R. Stephenson, LTD.

(57) ABSTRACT

Implementations of a microlens system may include a first layer including a first refractive index, the first layer including one or more substantially hemispherical elements formed therein; a second layer including a second refractive index coupled over the substantially hemispherical elements of the first layer; and a third layer including a third refractive index coupled over the second layer. A value of the first refractive index may be larger than a value of the third refractive index and a value of the second refractive index and the value of the second refractive index may be less than a value of the third refractive index.

20 Claims, 8 Drawing Sheets

(56) References Cited

U.S. PATENT DOCUMENTS

| | | | |
|---|---|---|---|
| 2015/0097109 A1* | 4/2015 | Maetaki | G01J 1/0407 |
| | | | 359/797 |
| 2015/0123227 A1* | 5/2015 | Ootsuka | G02B 3/0062 |
| | | | 257/432 |
| 2019/0081098 A1* | 3/2019 | Lenchenkov | H04N 25/75 |
| 2019/0123083 A1* | 4/2019 | Borthakur | H01L 27/14621 |
| 2020/0185443 A1* | 6/2020 | Itabasi | H01L 27/14685 |

* cited by examiner

FIG. 1

$$n_1 \sin \theta_1 = n_2 \sin \theta_2 = n_3 \sin \theta_3$$

FIG. 13

MULTI-LAYERED MICROLENS SYSTEMS AND RELATED METHODS

CROSS REFERENCE TO RELATED APPLICATIONS

This document claims the benefit of the filing date of U.S. Provisional Patent Application 62/955,712 entitled "Multi-Layered Microlens Systems and Related Methods" to Min Jang which was filed on Dec. 31, 2019, the disclosure of which is hereby incorporated entirely herein by reference.

This document also claims the benefit of the filing date of U.S. Provisional Patent Application 62/957,548, entitled "Multi-Layered Microlens Systems and Related Methods" to Min Jang which was filed on Jan. 6, 2020, the disclosure of which is hereby incorporated entirely herein by reference.

BACKGROUND

1. Technical Field

Aspects of this document relate generally to electromagnetic radiation sensors. More specific implementations involve image sensors.

2. BACKGROUND

Image sensors are used to detect various forms of light. Many image sensors contain a plurality of pixels that are used to sense incoming electromagnetic radiation and output corresponding electrical signals.

SUMMARY

Implementations of a microlens system may include a first layer including a first refractive index, the first layer including one or more substantially hemispherical elements formed therein; a second layer including a second refractive index coupled over the one or more substantially hemispherical elements of the first layer; and a third layer including a third refractive index coupled over the second layer. A value of the first refractive index may be larger than a value of the third refractive index and a value of the second refractive index. The value of the second refractive index may be less than a value of the third refractive index.

Implementations of microlens systems may include one, all, or any of the following:

The second layer may include a fluoropolymer.

The value of the first refractive index may be 1.56 with 550 nm wavelength electromagnetic radiation.

The value of the second refractive index may be 1.38 with 550 nm wavelength electromagnetic radiation.

The value of the third refractive index may be 1.4 with 550 nm wavelength electromagnetic radiation.

The third layer may include an antireflective coating.

The thickness of the second layer may be 500 nm.

Implementations of a microlens system may include a first layer including a first refractive index, the first layer including one or more substantially hemispherical elements formed therein; a second layer including a second refractive index coupled over the one or more substantially hemispherical elements of the first layer; and a third layer including a third refractive index coupled over the second layer. The value of the first refractive index may be larger than a value of the second refractive index and a value of the third refractive index. The value of the second refractive index may be larger than the value of the third refractive index.

Implementations of microlens systems may include one, all, or any of the following:

The second layer may include a fluoropolymer.

The value of the first refractive index may be 1.7 with 550 nm wavelength electromagnetic radiation.

The value of the second refractive index may be 1.38 with 550 nm wavelength electromagnetic radiation.

The value of the third refractive index may be 1.2 with 550 nm wavelength electromagnetic radiation.

The third layer may include an antireflective coating.

Implementations of a method of manufacturing a microlens system, the method may include applying a first layer to a semiconductor substrate including a plurality of pixels therein, the first layer including a first refractive index; patterning a microlens masking layer over the first layer; etching a plurality of substantially hemispherical elements into the first layer using the microlens masking layer; removing the microlens masking layer; applying a second layer with a second refractive index over the first layer; and applying a third layer with a third refractive index over the second layer.

Implementations of a method of manufacturing a microlens system may include one, all, or any of the following:

The value of the first refractive index may be larger than a value of the second refractive index and a value of the second refractive index. The value of the second refractive index may be larger than the value of the third refractive index.

The value of the first refractive index may be larger than a value of the third refractive index and a value of the second refractive index. The value of the second refractive index may be less than the value of the third refractive index.

The second layer may include a fluoropolymer.

The third layer may include an antireflective coating.

Patterning a microlens masking layer may further include reflowing a material of the microlens masking layer.

Etching a plurality of substantially hemispherical elements may further include projecting a size and a shape of the microlens masking layer into a material of the first layer during etching.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended microlens systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such microlens systems, and implementing components and methods, consistent with the intended operation and methods.

Microlenses are employed in various electromagnetic radiation sensors for the purpose of focusing one or more wavelengths of received electromagnetic radiation to a portion of the sensor that responds to the particular wavelength(s) using the characteristics of the material of the lens to refract the electromagnetic radiation. The degree of refraction/bending of electromagnetic radiation in a particular material is referred to as the refractive index of that material. The various electromagnetic sensors disclosed in this document may be used to detect a wide range of wavelengths of electromagnetic radiation, including, by non-limiting example, visible light, infrared, ultraviolet, radar, microwave, and any other electromagnetic radiation wavelength.

Where microlens systems are utilized to focus light on various pixels in a pixel array, various system designs have been devised. In a particular first design, the system is gapless and includes an antireflective coating (ARC) layer of oxide on the outer surface of the microlenses. In this design, the use of the ARC layer of oxide only increases quantum efficiency by about 0.5% through the anti-reflective effect of the oxide.

In another second design, gapless microlenses are formed using a reflow process which uses two photolithography steps to reach a fill factor of about 98% of the microlenses over the surface of the pixels. In the manufacturing process, a first set of reflowable microlenses are formed as spheres followed by a second set of reflowable microlenses formed as pin cushion shapes dispersed in between the spherical first set of reflowable microlenses. Because the initial shapes of the first set and second set of reflowable microlenses are different, the resulting reflowed microlenses have a residual difference in height between those microlenses that were from the first set and those from the second set. The effect of the difference is channel differences in quantum efficiency between adjacent pixels associated with microlenses that came from the different sets. This effect on quantum efficiency is sometimes referred to as a checkerboard effect.

In a third design, only pin cushion shaped reflowable microlenses are formed and then reflowed. However, in this process, a maximum fill factor of no more than 94% of the microlenses over the surface of the pixels exists because of adjacent microlenses will stick together if they are placed too close together during the reflow process. In addition, because of the starting shape of the pin cushion microlenses, each reflowed microlens has multiple focal points within the pixel, which causes quantum efficiency of the overall system to deteriorate.

Figure 1:
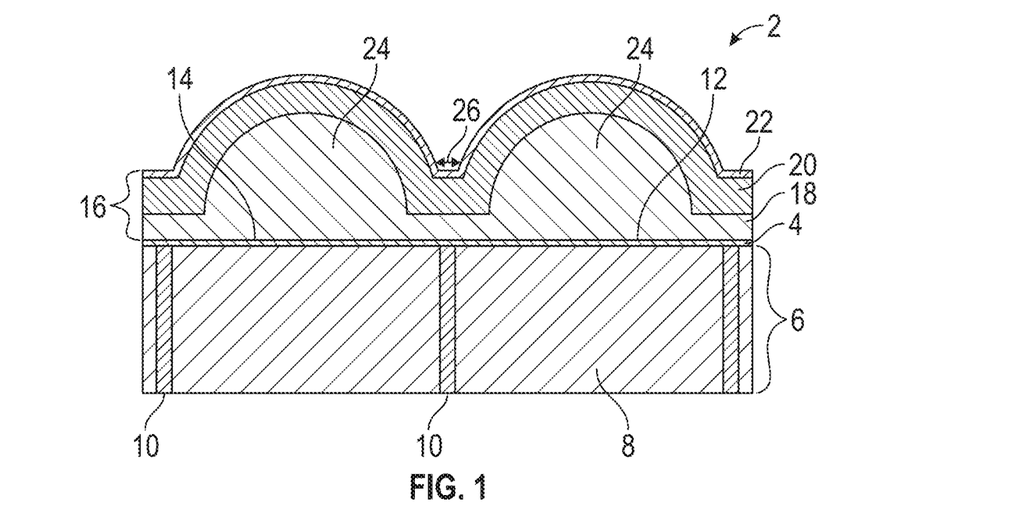
FIG. 1 is a cross sectional view of a first implementation of a microlens system.

Referring to FIG. 1, a first implementation of a microlens system 2 is illustrated. As illustrated, the photodiode portion 4 of the image sensor 6 is formed in a silicon substrate 8 which has deep trench isolation (DTI) features 10 between each of the pixels 12, 14 (though in various implementations DTI features may not be included). While the use of a silicon substrate is illustrated in this document, any other semiconductor substrate type may be utilized in various implementations including, by non-limiting example, glass, silicon-on-insulator, gallium arsenide, sapphire, ruby, silicon carbide or any other semiconductor substrate type. Above the silicon substrate/pixels 12, 14, a microlens layer 16 is coupled to the substrate 8. As illustrated in this cross-sectional view, the microlens layer 16 is formed of a continuous patterned film which contains various substantially hemispherical features positioned above each pixel. While a continuous patterned film is illustrated in this implementation, in other implementations, the film may be divided into one or more sections. As illustrated the microlens layer 16 includes three different layers of material a first layer 18, a second layer 20, and a third layer 22. As illustrated, the material of the first layer 18 is formed into a plurality of substantially hemispherical shapes 24. The material of the second layer 20 is formed over the substantially hemispherical shapes 24 and the material of the third layer 22 is formed over the material of the second layer 20. In a particular implementation, a spacing between each microlens of the plurality of microlenses may be 0.3 μm as indicated by arrow 26.

In the particular implementation illustrated, the material of the first layer 18 has an index of refraction of about 1.56 for 550 nm wavelength electromagnetic radiation (yellow visible light). In various implementations, the particular materials which the first layer 18 may be made of may be any that have this index of refraction, including, by non-limiting example, any polyester based material with a high transmittance. In the implementation illustrated in FIG. 1, coupled over the first layer 18 is a second layer 20 that includes a fluoropolymer with an index of refraction of about 1.38 with 550 nm electromagnetic radiation. In various implementations, the second layer 20 may be any material with substantially this index of refraction.

As illustrated in FIG. 1, coupled over the second layer 20 is a third layer 22. In the implementation illustrated, the third layer 22 forms in antireflective coating (ARC) layer. In various implementations, the material of the ARC layer is an oxide ($SiO_2$ in this case). The material of the third layer 22 has an index of refraction of about 1.4 with 550 nm electromagnetic radiation. In various implementations, the third layer 22 may be any material with substantially this index of refraction, such as, by non-limiting example, silicon dioxide ($SiO_2$). In such implementations, the third layer may be deposited through plasma enhanced chemical vapor deposition (PECVD).

In various implementations, it has been observed that the use of a multi-layer stack of materials with different refractive indexes for the microlens layer 16 is what creates a microlens system that, in combination with the pixel, creates improved quantum efficiency and other effects (discussed later in this document). In various implementations, the range of thicknesses of the third layer 22 may range between about 100 nm to about 120 nm; the range of thicknesses of the second layer 20 may range between about 200 nm to about 800 nm, and the range of thicknesses of the first layer 18 may range between about 900 nm to about 1500 nm. In a particular implementation, the second layer 20 may be about 500 nanometers thick.

Figure 2:
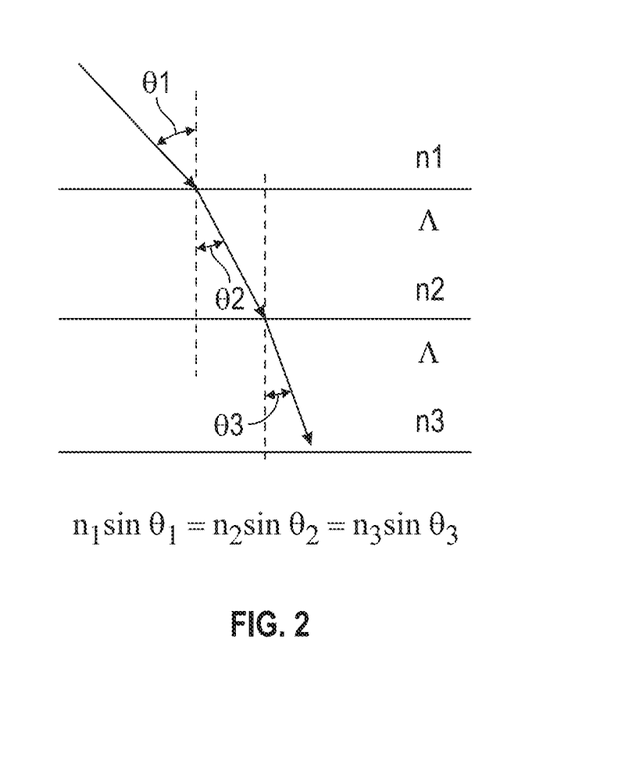
FIG. 2 is a diagram of electromagnetic radiation passing through three layers of material with different refractive indices.

In the system implementation illustrated in FIG. 2, the index of refraction of the material of the first layer 18 is larger than the indices of refraction of both of the second layer 20 and the third layer 22. In this implementation, the index of refraction of the second player 20 is less than the index of refraction of the third layer 22.

In other implementations however, this relationship of the indices of refraction may differ even while the overall structure of the microlens system may remain the same. Referring to FIG. 2, a diagram of the respective indices of refraction of the first, second, third layers is illustrated for another implementation of a microlens system. In this implementation, the index of refraction of the first layer is larger than the index of refraction of both the second layer and third layer but, in this case, the index of refraction of the third layer is smaller the index of refraction of the second layer. In FIG. 2, index n1 is the refractive index of the third layer, index n2 is a refractive index of the second layer, and index n3 is a refractive index of the first layer. The effect in this implementations as illustrated in FIG. 2, is that the light bends consecutively from layer to layer toward the material of each pixel as it travels through the three layers.

In the implementation of FIG. 2, the second layer is a fluoropolymer material like any previously disclosed in this document with an index of refraction of about 1.38 for 550 nm wavelength electromagnetic radiation. The material of the first layer has an index of refraction of about 1.2 for 550 nm wavelength electromagnetic radiation and the material of the third layer has an index of refraction of about 1.7 for 550 nm wavelength electromagnetic radiation. In various implementations, the material of the first layer and/or the material of the third layer may be changed to create the desired angling effect. Examples of materials that may be employed for the material of the first layer may be, by non-limiting example, any siloxane based polymers with or without inorganic fillers such as $TiO_2$. Examples of materials that may be employed for the material of the second layer may be, by non-limiting example, any material having an equivalent refractive index to the fluoropolymers disclosed herein. In various implementations, the material of the third layer may be any ARC layer material disclosed herein. In various implementations like those illustrated for the version of FIG. 2, the range of thicknesses of the first layer may range between about 900 nm to about 1500 nm; the range of thicknesses of the fluoropolymer layer may range between about 200 nm to about 800 nm, and the range of thicknesses of the third layer may range between about 100 nm to about 120 nm. In a particular implementation, the fluoropolymer layer may be about 500 nanometers thick. A wide variety of combinations of material types for the first, second, and third layer may be constructed using the principles disclosed in this document.

Figure 3:
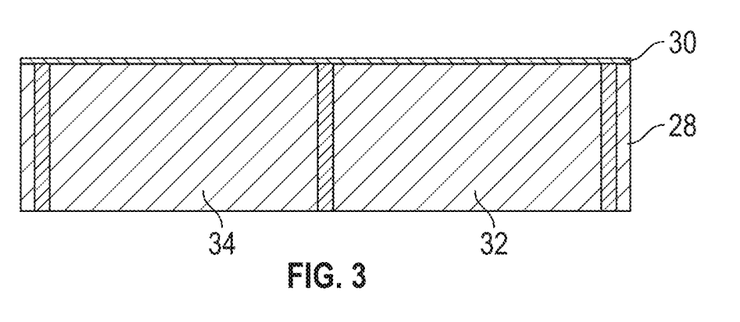
FIG. 3 is a cross sectional view of a semiconductor substrate.
Figure 4:
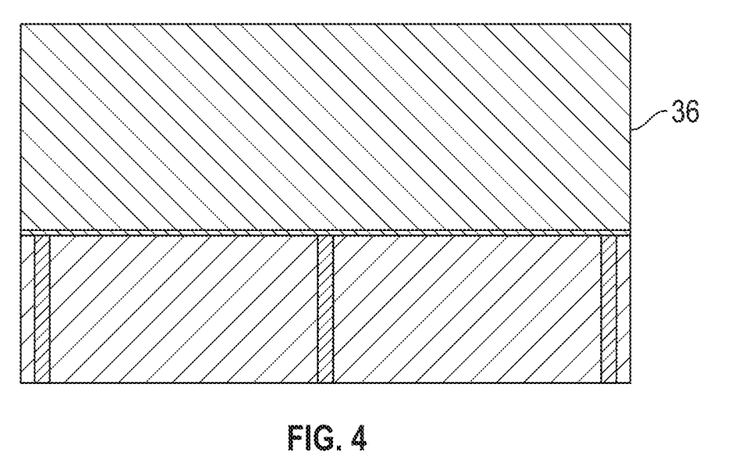
FIG. 4 is a cross sectional view of a semiconductor substrate with an implementation of a first layer thereon.
Figure 5:
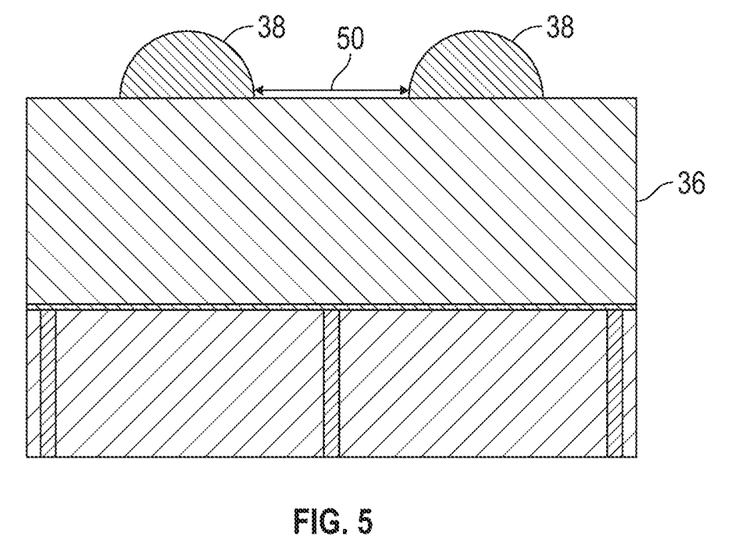
FIG. 5 is a cross sectional view of the substrate of FIG. 4 with a microlens masking layer formed thereon.
Figure 6:
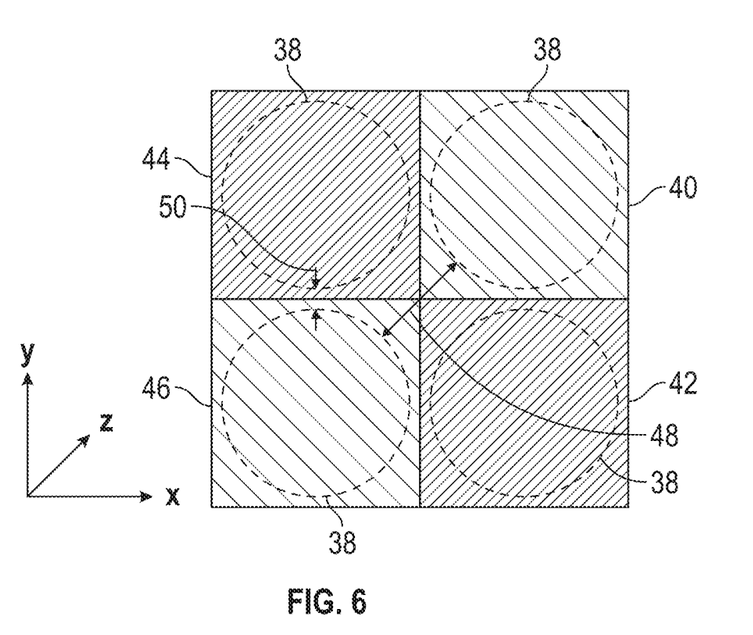
FIG. 6 is a top down diagram view of a microlens masking layer illustrating the position of four microlenses.
Figure 7:
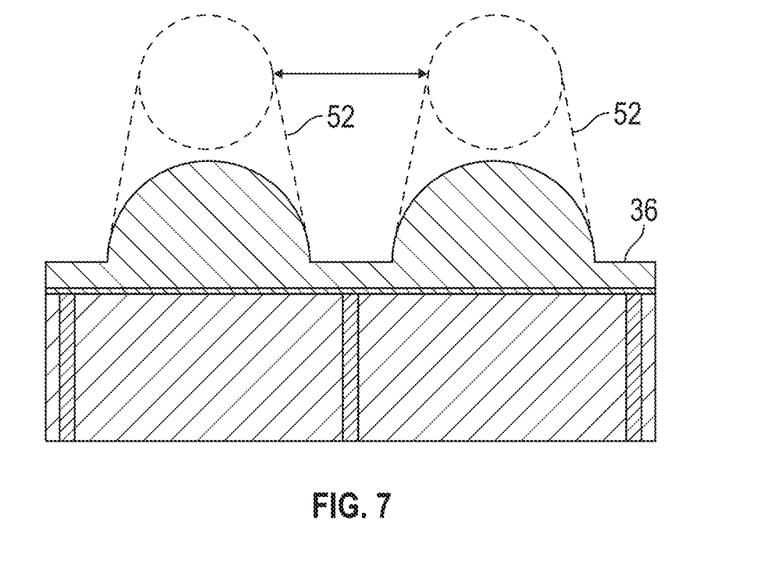
FIG. 7 is a cross sectional diagram view of the substrate of FIG. 5 during/after an etching process.
Figure 8:
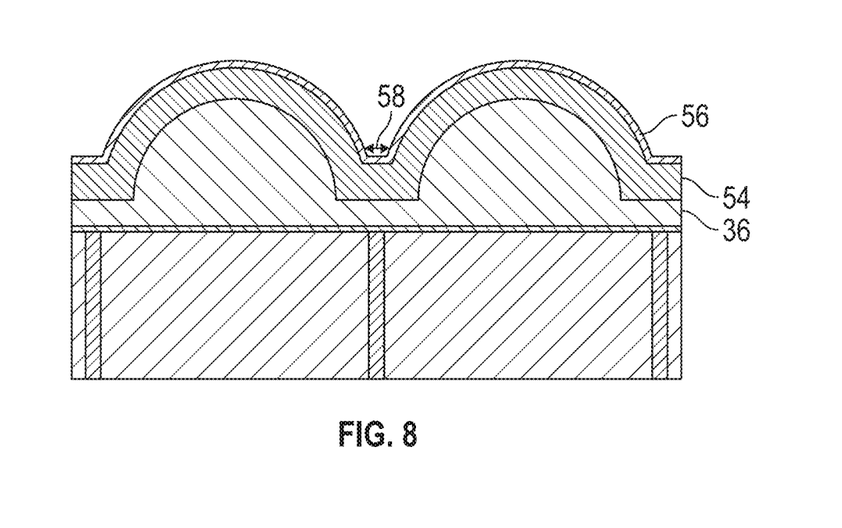
FIG. 8 is a cross sectional view of the substrate of FIG. 7 following formation of a second layer and third layer over the first layer.

FIGS. 3-8 illustrates an implementation of a microlens system at various steps of an implementation of a method of forming a microlens system like the implementation illustrated FIG. 8 which is like the implementations illustrated in FIG. 1. Referring to FIG. 3, the incoming silicon substrate 28 is illustrated with a plurality of pixels defined with DTI structures covered by a layer of a high dielectric constant (high-K) material 30 that includes active portions of the pixels 32, 34 themselves. A planar layer of a first material is then coupled over the high-K layer through a coating/deposition process to form a first layer 36 as illustrated in FIG. 4. In FIG. 5, the first layer 36 is illustrated following photolithographic patterning followed by reflowing of a microlens masking layer 38 on top of the planar layer/first layer 36. In the cross sectional view of FIG. 5 with figure illustrates how the shape of the patterned microlens masking layer following the reflow operation form a plurality of substantially hemispherical shapes.

Referring to FIG. 6, a top down view of four adjacent pixels 40, 42, 44, and 46 illustrates the spacing of an implementation of the hemispheres of the microlens masking layer relative to each other with line 50 being the same distance 50 illustrated in FIG. 5 (FIG. 5 is not drawn to the same scale as FIG. 6). As illustrated, in this implementation, each hemisphere is about 0.3 microns away from each directly adjacent hemisphere, but the diagonal distance 48 between hemispheres is about 1.4 microns. This particular geometric relationship of the hemispheres of the microlens masking layer 38 permits microlenses to be located in the desired relationship to each other and each pixels following the subsequent etching step.

Referring to FIG. 7, the microlens system is illustrated following etching of the material of the first layer 36 and following removal of the microlens masking layer 38. As illustrated, the etching process is not completely anisotropic nor isotropic, but causes a projection 52 of the size and shape of the microlens masking layer 38 into the material of the first layer 36. In some implementations, during the etching of the first layer 36 the material of the microlens masking layer 38 may be removed entirely; in other implementations, a separate removal step may be used to remove the material of the microlens masking layer 38.

Following the etching process, the material of the second and third layers is deposited/formed over the material of the first layer. Referring to FIG. 8, the microlens system is illustrated following an in situ deposition of fluoropolymer over the etched first layer to form second layer 54. As illustrated, the in situ deposition is substantially conformal as the material takes on the shape of the etched hemispheres in the etched first layer 36. The in situ deposition may be plasma enhanced in particular implementations or may involve only vapor deposition in various implementations. The third layer 56 which in this case, is an oxide ARC layer, is then deposited on the fluoropolymer the second layer 54 using a chemical vapor deposition process which may or may not be plasma enhanced in various implementations. The net result of the deposition process is to maintain a specific distance 58 between adjoining microlenses.

In various method implementations, the material of the high refractive index layer may be processed in a similar fashion using a microlens masking layer to form a plurality of hemispherical structures in the layer for various materials. However, the particular dimensions of the microlens masking layer may be adjusted and the etching conditions/ chemistry(ies) may be adjusted to correspond with that which is designed to form the hemispherical structures/substantially hemispherical structures in the first layer at the desired location relative to one another and the pixels. A fluoropolymer material is then deposited using an in situ technique like those disclosed herein to form a substantially conformal layer over the resulting hemispherical structures. The material of the third layer is then coupled over the fluoropolymer material using a deposition/formation process consistent with the type of material being applied such as, by non-limiting example, chemical vapor deposition, plasma enhanced chemical vapor deposition, in situ techniques, sputtering, or any technique capable of depositing the material of the third layer with the desired refractive index.

Figure 9:
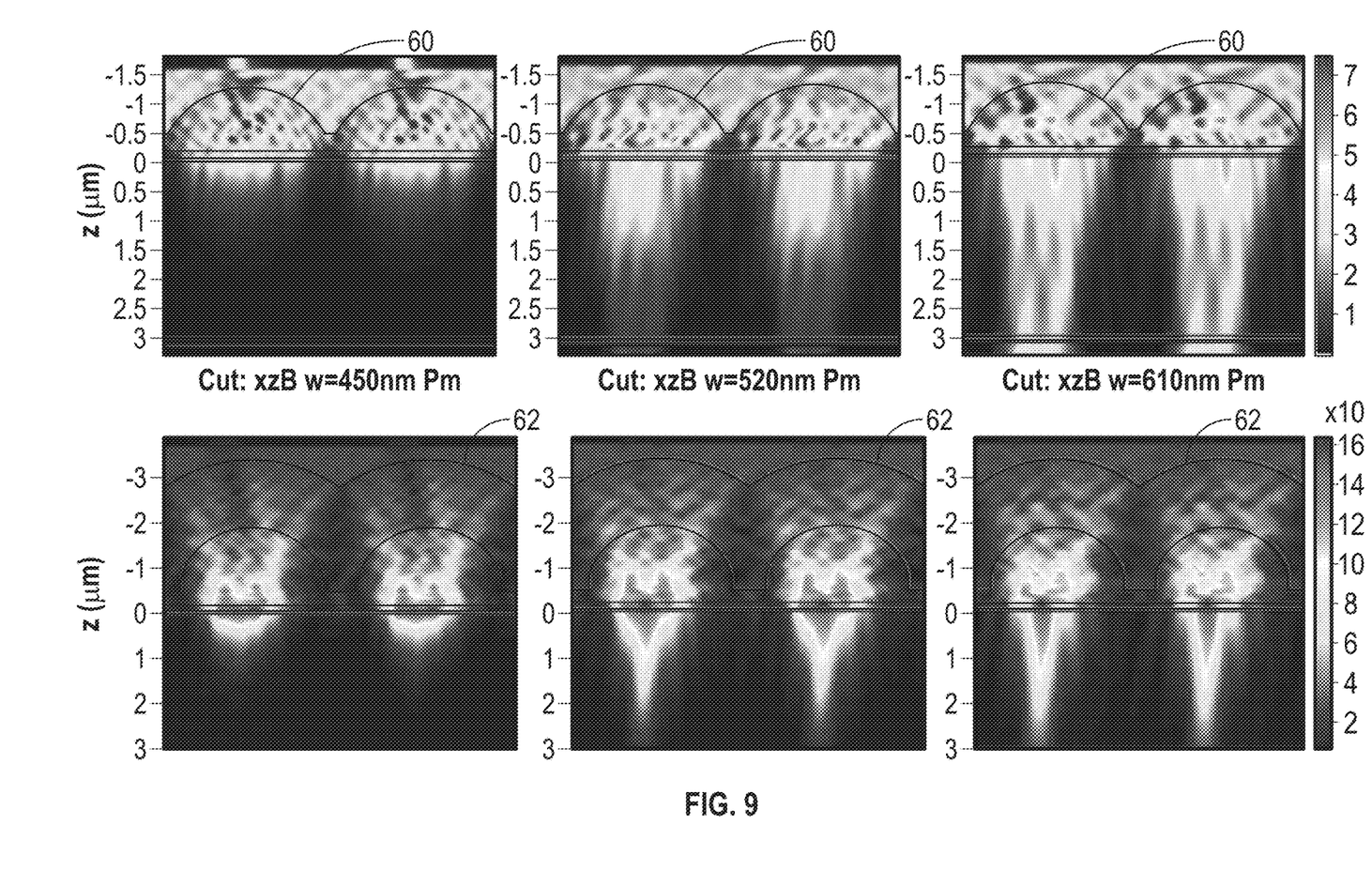
FIG. 9 is a set of comparative optical simulation diagrams for a pin cushion microlens system and etched microlens system.

Referring to FIG. 9, various results of optical simulations are illustrated. At the lower left (upper three plots) a power plot of a simulation showing how a microlens system formed using a pincushion reflow processes the focuses electromagnetic radiation over the corresponding pixel and the penetration into the material of the substrate at three observed wavelengths, blue (450 nm), green (520 nm), and red (610 nm). The shape and dimensions of the pincushion microlenses are illustrated by lines 60 and the three top figures. The lower three plots in the power plot are a simulation using an etched microlens system like that disclosed in this document with hemispheres with a radius of curvature of 2.15 microns at three points in time corresponding with the upper three plots. The shape of the microlenses is illustrated by lines 62 in the lower three figures. As illustrated, the etched microlens system immediately focuses the electromagnetic radiation toward the center of the pixel and the resulting intensity of the penetration of the radiation is much higher at the center of the pixel. Also, the deleterious effect of having multiple local points on the ability of the pincushion lenses to focus the light into the pixel is illustrated in a much broader spread of the light into the pixel of FIG. 9. The etched microlenses illustrated in in FIG. 9 collect light across the visible wavelength ranges more efficiently than a pincushion microlens assembly.

Figure 10:
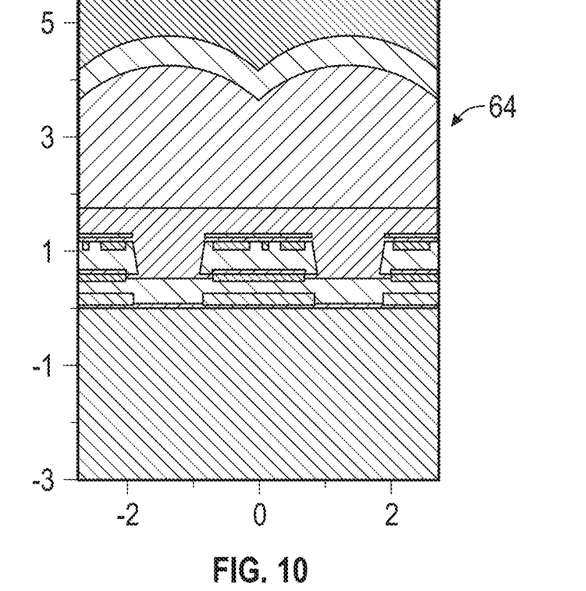
FIG. 10 is a cross sectional view of an implementation of an etched microlens system and corresponding device.
Figure 11:
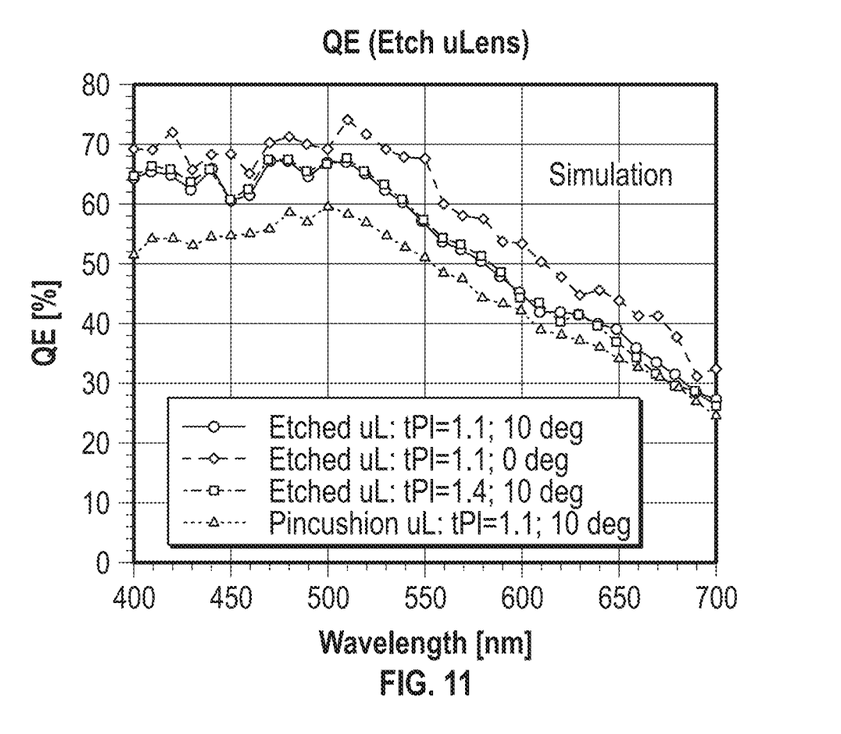
FIG. 11 is a graph of a simulation of quantum efficiency percentage by wavelength for three etched microlens systems versus a pin cushion microlens system.

A simulation was conducted to determine the quantum efficiency of an image sensor device across a range of electromagnetic radiation wavelengths (400 nm to 700 nm). FIG. 10 illustrate a cross-sectional view of the particular front side integrated image sensor device 64 used in the simulation. In the chart of the results illustrated in FIG. 11, the first three series represent etched microlens systems like those disclosed in this document and the fourth series represents a pincushion reflowed microlens system used for comparison. In the first two series, the thickness of the planar layer/first layer from which the hemispheres are formed varies was 1.1 microns and the incident angle of the electromagnetic radiation was 10 degrees from normal to 0 degrees from normal to the surface of the image sensor. In the third series, the thickness of the planar layer was increased to 1.4 microns and the incident angle of the electromagnetic radiation was 10 degrees. By observation, increasing the thickness of the planar layer did not have much effect on the quantum efficiency. Not surprisingly, where the light was normal to the image sensor the quantum efficiency increased correspondingly as was expected for a front side integrated (FSI) image sensor device. In comparison with the fourth series which was the pincushion microlens system, all of the microlens systems performed better for QE across the entire range of wavelengths. The peak QE for the etched microlenses was 67.4% which was higher than the pincushion reflowed microlenses at 59.6%.

Test image sensors employing etched microlenses like those disclosed in this document were then fabricated, and further QE testing performed using the test image sensors across light wavelengths of 350 nm to 1090 nm. Referring to p. 11 of Appendix A, the results of the experiment are illustrated for three devices with the etched multiple layer microlens system versus three devices with a pin cushion reflow microlens system. As illustrated, each of the three devices with the etched multiple layer had a higher QE across the wavelength range than any of the pin cushion reflow devices.

Figure 12:
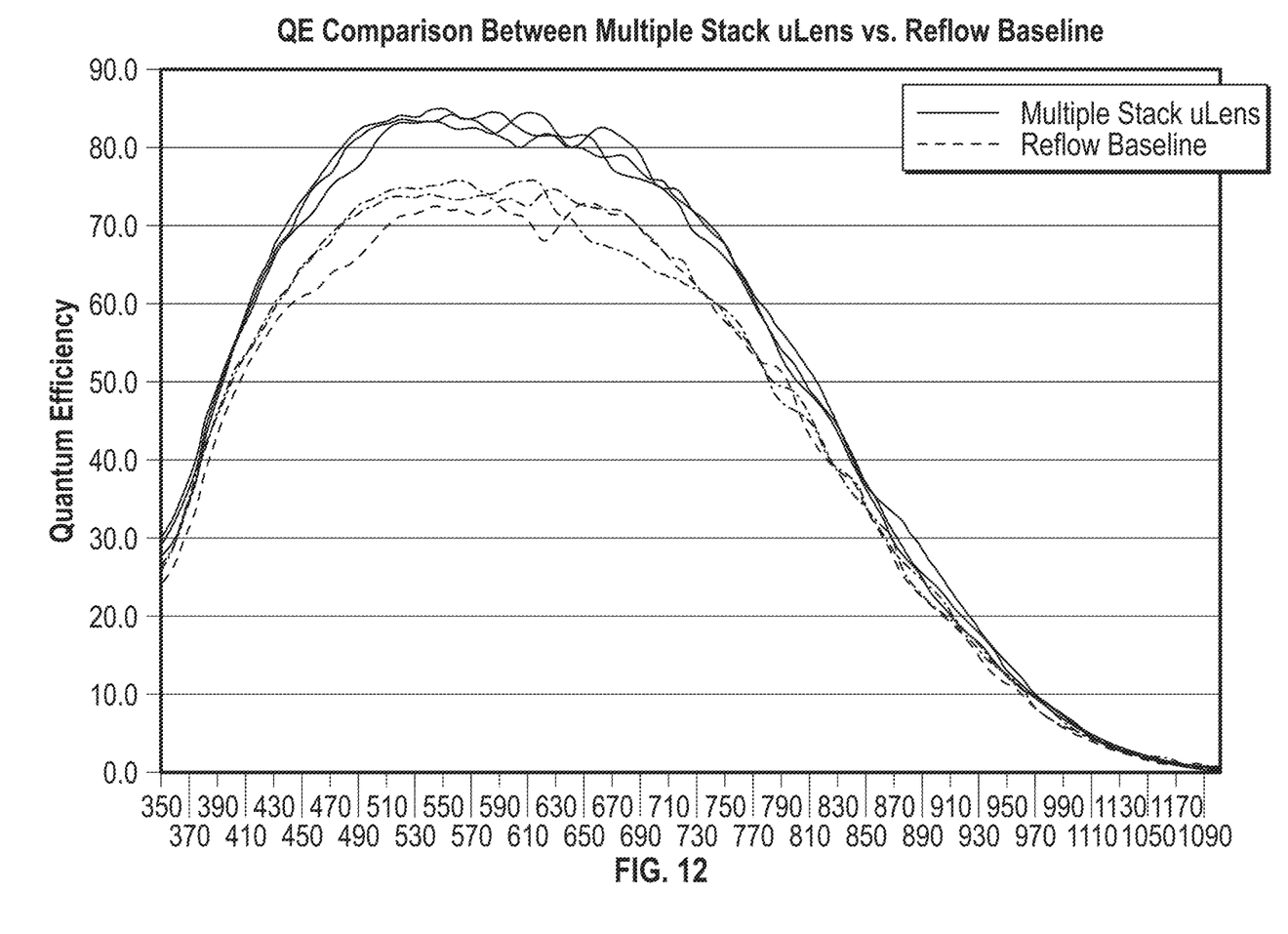
FIG. 12 is a graph of experimental data of quantum efficiency by wavelength for a multiple stack/etched microlens system versus a reflowed microlens system.
Figure 13:
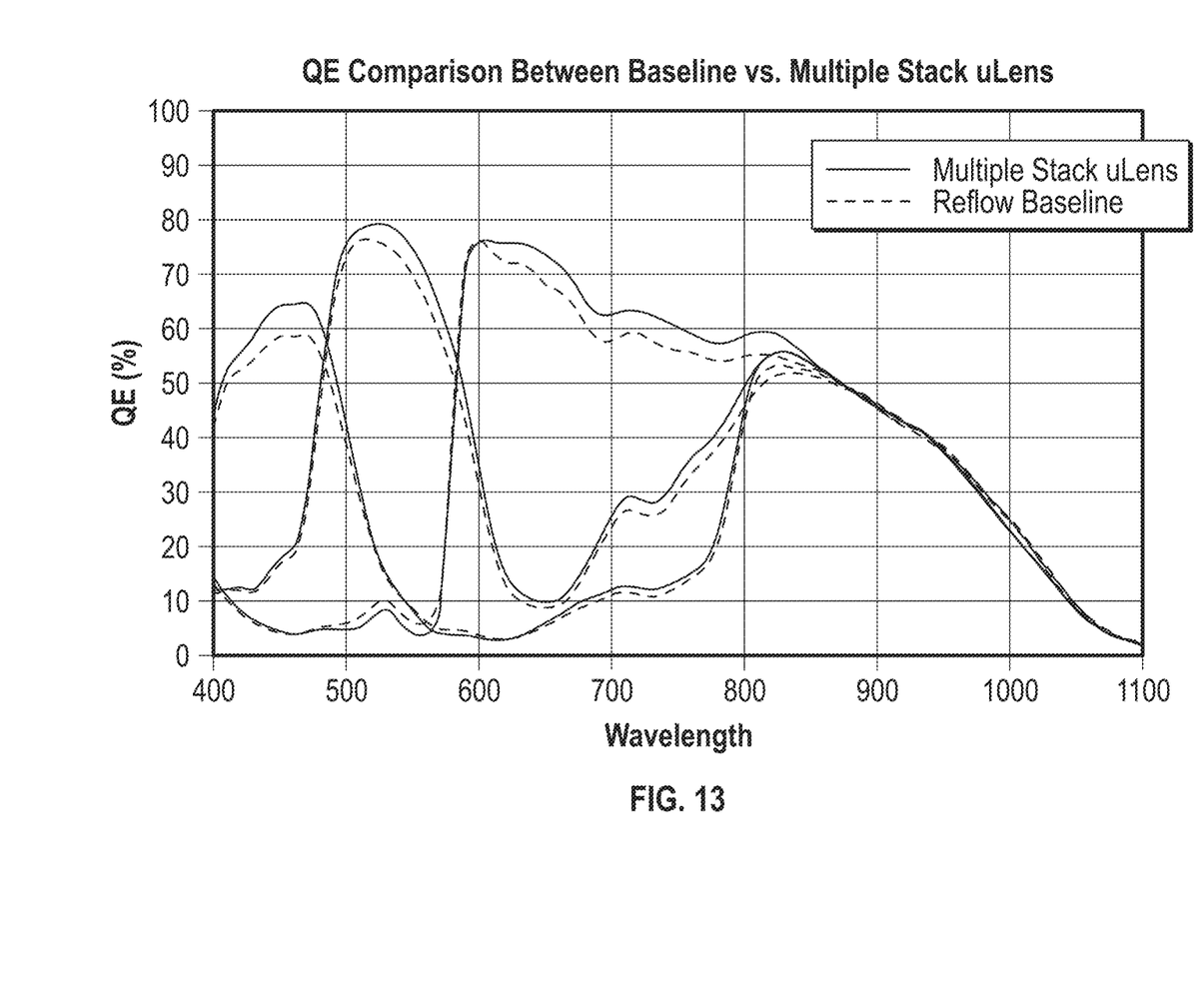
FIG. 13 is another graph of experimental data of quantum efficiency by wavelength for a multiple stack/etched microlens system versus a reflowed microlens system.

Additional test image sensors employing etched multiple layer microlenses like those disclosed in this document that utilize 6 micron epitaxial devices were tested across the visible and near infrared (NIR) electromagnetic radiation wavelengths. A baseline device using a pincushion reflowed microlens system was also tested for comparison. Overall, the QE measured was higher than the baseline pincushion reflowed microlens system. Also, the cross talk observed between the pixels for the etched multiple layer microlens system was lower indicating that the modulation transfer function (MTF) of the device would be better than the baseline device. Experimental data illustrated in FIG. 12 indicates that microlens systems like those disclosed in this system demonstrate 11% better maximum peak QE compared to baseline microlens systems. The observed data also demonstrated an 8% improvement in average QE across all wavelengths as well. The results illustrated in FIG. 13 across wavelengths 400 nm to 1100 nm demonstrate crosstalk reduction leading to better MTF. The data in FIGS. 12-13 also indicates that the ability to better focus the light to the center of the pixel produces better results across various wavelength ranges for various devices.

In various implementations, the use of multilayers and etching also may eliminate the checkerboard effect observed in other microlens implementations while reducing process complexity and process steps. Finally, the ability to directly control the shapes of the hemispheres using the microlens masking layer and the materials applied in each layer may provide much better control of microlens shape and refraction characteristics leading to increased ability to optimize QE and other image sensor characteristics.

In places where the description above refers to particular implementations of microlens systems and implementing components, sub-components, methods and sub-methods, it should be readily apparent that a number of modifications may be made without departing from the spirit thereof and that these implementations, implementing components, sub-components, methods and sub-methods may be applied to other microlens systems.

What is claimed is:
1. A microlens system comprising:
 a first layer comprising a first refractive index, the first layer comprising one or more substantially hemispherical elements;
 a second layer comprising a second refractive index over the one or more substantially hemispherical elements of the first layer; and
 a third layer comprising a third refractive index over the second layer, wherein the second layer is between the first layer and the third layer;
 wherein a surface of the third layer facing away from the second layer comprises one or more curves corresponding in location to the one or more substantially hemispherical elements;

wherein a value of the first refractive index is larger than a value of the third refractive index and a value of the second refractive index; and wherein the value of the second refractive index is less than the value of the third refractive index.

2. The system of claim 1, wherein the first layer comprises a first single and continuous layer, wherein the second layer comprises a second single and continuous layer, and wherein the third layer comprises a third single and continuous layer.

3. The system of claim 1, wherein the value of the first refractive index is 1.56 with 550 nm wavelength electromagnetic radiation.

4. The system of claim 1, wherein the value of the second refractive index is 1.38 with 550 nm wavelength electromagnetic radiation.

5. The system of claim 1, wherein the value of the third refractive index is 1.4 with 550 nm wavelength electromagnetic radiation.

6. The system of claim 1, wherein the third layer comprises an antireflective coating.

7. The system of claim 1, wherein a thickness of the second layer is 500 nm.

8. A microlens system comprising:
a first layer comprising a first refractive index, the first layer comprising one or more substantially hemispherical elements;
a second layer comprising a second refractive index contacting the one or more substantially hemispherical elements of the first layer; and
a third layer comprising a third refractive index contacting the second layer, wherein the second layer is between the first layer and the third layer;
wherein a surface of the first layer facing away from the second layer is substantially flat;
wherein the first layer comprises a single and continuous layer;
wherein a value of the first refractive index is larger than a value of the third refractive index and a value of the second refractive index; and
wherein the value of the second refractive index is less than the value of the third refractive index.

9. The system of claim 8, wherein the second layer comprises a fluoropolymer.

10. The system of claim 8, wherein the value of the first refractive index is 1.56 with 550 nm wavelength electromagnetic radiation.

11. The system of claim 8, wherein the value of the second refractive index is 1.38 with 550 nm wavelength electromagnetic radiation.

12. The system of claim 8, wherein the value of the third refractive index is 1.4 with 550 nm wavelength electromagnetic radiation.

13. The system of claim 8, wherein the third layer comprises an antireflective coating.

14. The system of claim 8, wherein a thickness of the second layer is 500 nm.

15. A microlens system comprising:
a first layer comprising a first refractive index, the first layer comprising one or more substantially hemispherical elements;
a second layer comprising a second refractive index contacting the one or more substantially hemispherical elements of the first layer; and
a third layer comprising a third refractive index contacting the second layer, wherein the second layer is between the first layer and the third layer;
wherein a surface of the first layer facing away from the second layer is substantially flat;
wherein the first layer comprises a single and continuous layer;
wherein a surface of the third layer facing away from the first layer comprises a plurality of curves;
wherein a value of the first refractive index is larger than a value of the third refractive index and a value of the second refractive index; and
wherein the value of the second refractive index is less than the value of the third refractive index.

16. The system of claim 15, wherein the second layer comprises a fluoropolymer.

17. The system of claim 15, wherein the value of the first refractive index is 1.56 with 550 nm wavelength electromagnetic radiation.

18. The system of claim 15, wherein the value of the second refractive index is 1.38 with 550 nm wavelength electromagnetic radiation.

19. The system of claim 15, wherein the value of the third refractive index is 1.4 with 550 nm wavelength electromagnetic radiation.

20. The system of claim 15, wherein a thickness of the second layer is 500 nm.

\* \* \* \* \*